United States Patent [19]
Yukshing

[11] Patent Number: 5,848,014
[45] Date of Patent: Dec. 8, 1998

[54] SEMICONDUCTOR DEVICE SUCH AS A STATIC RANDOM ACCESS MEMORY (SRAM) HAVING A LOW POWER MODE USING A CLOCK DISABLE CIRCUIT

[75] Inventor: Antony Ng Yukshing, New Malden, United Kingdom

[73] Assignee: Cypress Semiconductor Corp., San Jose, Calif.

[21] Appl. No.: 874,006

[22] Filed: Jun. 12, 1997

[51] Int. Cl.$^6$ ........................................... G11C 5/14
[52] U.S. Cl. ............................. 365/227; 365/233
[58] Field of Search ................... 365/226, 227, 365/233, 189.12, 194

[56] References Cited

U.S. PATENT DOCUMENTS

| | | | |
|---|---|---|---|
| 5,247,164 | 9/1993 | Takahashi | 365/227 |
| 5,247,655 | 9/1993 | Khan et al. | 365/227 |
| 5,337,285 | 8/1994 | Ware et al. | 365/227 |
| 5,430,393 | 7/1995 | Shankar et al. | 327/142 |
| 5,452,434 | 9/1995 | MacDonald | 395/550 |
| 5,563,839 | 10/1996 | Herdt et al. | 365/227 |

Primary Examiner—Son Mai
Attorney, Agent, or Firm—Maiorana & Acosta, P.C.

[57] ABSTRACT

An internal clock signal disable circuit is disclosed for disabling an internal clock signal used in a synchronous static random access memory (SRAM). The reduced power mode is preferably a sleep mode commanded by assertion of a reduced power command signal, which may be a Jedec-standard "ZZ" signal. The disable circuit includes a pair of latch devices clocked by clock signals deriving from the external clock signal applied to the SRAM. The ZZ signal is applied to the input of the first latch, whose output is connected to the input of the second latch. The output of the second latch is processed to generate disable signals for disabling generation of the internal clock signal used on the device. The pair of latches insures that a delay is introduced prior to disabling the internal clock so that at least one clock pulse of the internal clock signal is generated before the internal clock is shut down. The ZZ signal is also applied to chip enable input buffers, which cause such buffers to output a signal as if a non-active chip enable signal was actually applied to the device. The non-active chip enable signals thus output from the input buffers are captured by respective chip enable registers by the above-mentioned at least one further clock pulse. Through the foregoing, no external deselection of the device need be made prior to asserting the reduced power command signal (i.e., "ZZ").

21 Claims, 2 Drawing Sheets

SEMICONDUCTOR DEVICE SUCH AS A STATIC RANDOM ACCESS MEMORY (SRAM) HAVING A LOW POWER MODE USING A CLOCK DISABLE CIRCUIT

BACKGROUND OF THE INVENTION

1. Field of the Invention

The present invention relates to semiconductor devices, and, more particularly, to a method and circuit for reducing power consumption in an SRAM device using a clock disable circuit.

2. Discussion of the Related Art

Present day electrical products often incorporate semiconductor devices due to their many advantages. The use of such devices has enabled electrical products to accomplish tasks more quickly and efficiently than was previously possible. In an effort to continually improve such products, a desired goal has been to reduce the amount of power consumed during the operation of such products. Towards this end, it is desirable to reduce the power consumption of a product's component parts, including any semiconductor devices. One way to accomplish this goal, generally, is to place the semiconductor device in a "powered down" or "sleep" mode so that the device draws a reduced amount of current, and therefore, consumes less power.

One approach taken in the art in reducing device power consumption has been to "gate off" or otherwise disable input buffers of the device, as well as other current sinking elements. While this approach may be satisfactory for some semiconductor devices, increasingly, many devices are responsive to an externally applied clock signal for their operation. A characteristic of such devices is that they include a clock buffer and internal clock generation circuitry, as well as other circuits, which draw current while the external clock signal is toggling. The operation of internal clock-dependent circuitry contributes significantly to power consumption.

Thus, another approach taken in the art involves disabling generation of an internal clock signal, using a simple logic gate, when a reduced power mode is desired. While relatively simple in implementation, such an approach has several disadvantages. First, depending upon the application, such an approach may be prone to generating false clock edges or pulses. In a synchronous device, where internal elements may change states according to clock edges or pulses, such a result can be disastrous as it may place the device in an unknown state. In addition, such an approach generally requires a relatively complex external set-up procedure wherein one or more control, address, and/or data signals must be asserted and/or deasserted prior to disabling the internal clock signal (for proper operation).

A specific example will illustrate the shortcomings of the conventional approaches. A jedec-standard package for semiconductor devices such as a synchronous cache SRAM defines a "ZZ" input pin, which is configured to place the device in a so-called "sleep" mode for reducing power consumption. The device (e.g., SRAM) is clocked with an externally applied clock signal, with the ZZ "sleep" input signal being permitted to be activated asynchronously relative to the external clock. According to conventional approaches, however, before activating ZZ, the device is preferably first deselected by controlling chip enable input signals (e.g., CE and/or $\overline{CE}$). Thus, to effectively use the reduced power "sleep" mode, a relatively complex setup procedure must be followed. Moreover, data integrity may be impaired if the clock disable circuit does not stop and start the internal clock in a controlled manner.

Accordingly, there is a need to provide a method and circuit for placing a semiconductor device in a reduced power mode that minimizes or eliminates one or more of the problems set forth above.

SUMMARY OF THE INVENTION

It is one object of the present invention to provide a semiconductor device that can be placed in a reduced power mode of operation through a single input/output pin of the device. It is another object of the present invention to control a device's internal clock sufficiently to maintain the device in a known state, and thus preserve data integrity.

To meet these and other objects, a semiconductor device according to the present invention includes an internal clock disable circuit configured to implement a reduced power mode. The device includes means responsive to a reduced power command signal for outputting a disable signal, and an internal clock generating means. The internal clock generating means is configured to generate an internal clock signal in response to an external clock signal. The internal clock generating means may be further configured to discontinue generating the internal clock signal in response to the above-mentioned disable signal, thereby reducing power consumption. Importantly, the disable signal outputting means includes means for outputting the disable signal such that the generated internal clock signal is maintained for at least one clock pulse after the reduced power command signal is applied to the device. That is, the generation of the disable signal is delayed relative to the application of the reduced power command signal so that at least one further internal clock pulse is generated. The further internal clock pulse may be operative to internally deselect the device, thus obviating any need to deselect the device externally prior to entering the reduced power mode.

One advantage of an embodiment according to the present invention is a mode of operation that substantially reduces power consumption relative to conventional devices. Another advantage is that a device according to the invention may be placed in a reduced power mode of operation through a single pin on the device. This is made possible by the above-mentioned further internal clock pulse(s), internally deselecting the device.

In a preferred embodiment, the means for outputting the disable signal includes a pair of latches that may define a pipeline register. The reduced power command signal is applied to an input terminal of the pipeline register, which is then clocked therethrough by a clocking signal corresponding to the external clock signal to generate the disable signal. The pipeline register thus introduces a delay between the external application of the reduced power command signal and the generation of the disable signal. This delay allows non-active chip enable signals to be generated internally, and which are applied to respective chip enable registers. The further clock pulse may then be used to clock the chip enable registers, thus completing internal deselection.

In another aspect of the invention, a method of operating a semiconductor device according to the present invention is provided and which includes four basic steps. The first step involves generating an internal clock signal according to an external clock signal applied to the device. Second, instructing the device to reduce power consumption, for example, by applying a reduced power command signal to the device. The third step involves generating at least one further internal clock pulse according to the external clock signal after application of the reduced power command signal. The last step involves discontinuing the internal clock signal after the at least one further internal clock pulse has been generated. In this method of operating a semiconductor device, the at least one clock pulse may be operative to clock a non-active chip enable signal into a chip enable register of the device to thereby obviate externally applying deselection signals to the device prior to applying the reduced power command signal.

In an additional embodiment, this method of operating a semiconductor device may also include the further steps of discontinuing the applying (second) step and delaying, for a predetermined time interval, the generating (third) step. The predetermined time interval may comprise a first period of time to write the reduced power is signal in a first latch. This predetermined time interval may further comprise a second period of time sufficient to write the reduced power signal in a second latch.

These and other features and objects of this invention will become apparent to one skilled in the art from the following detailed description and the accompanying drawings illustrating features of this invention by way of example, but not by limitation.

DETAILED DESCRIPTION OF THE PREFERRED EMBODIMENTS

Figure 1:
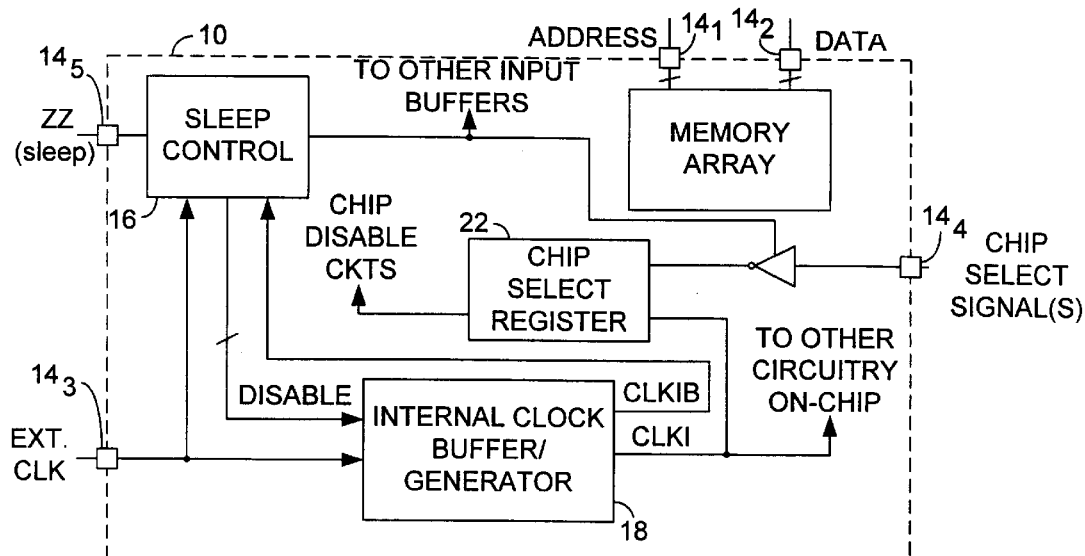
FIG. 1 is a simplified schematic and block diagram view of a semiconductor device according to a preferred embodiment of the present invention.

Referring now to the drawings wherein like reference numerals are used to designate identical components in the various views, FIG. 1 shows, in block diagram form, a semiconductor device 10 embodying the present invention. Device 10, in a preferred embodiment, is a synchronous cache RAM (static RAM hereinafter "SRAM"). SRAM 10 according to a preferred embodiment may include a memory array 12, interface pins $14_i$, means such as a sleep control circuit 16 for generating a disable signal, means such as an internal clock buffer/generator circuit 18 for generating an internal clock signal, an input buffer 20, and a chip enable register 22. While the present invention is herein described in accordance with a preferred synchronous cache SRAM embodiment 10, the principles of the present invention may be used in connection with other types of semiconductor devices where a reduced power mode may be desirable or required.

Memory array 12 may be coupled to an address bus and a data bus by way of a respective plurality of interface pins, designated diagrammatically at $14_1$, and $14_2$. Array 12 is configured for the storage and retrieval of data or information. This aspect of SRAM 10 is conventional and will not be discussed in any further detail.

Sleep control circuit 16 is configured to output one or more disable signals in response to a reduced power command signal. The command signal may be a Jedec-standard ZZ "sleep" input signal in the preferred SRAM embodiment. The disable signal is applied to the internal clock buffer/generator 18 to disable the internal clock. Sleep control circuit 16 is also responsive to an external clock signal (designated EXT. CLK.) input on an interface pin designated $14_3$, as well as a complemented version of an internal clock signal, designated CLKIB. In addition to the disable signal, sleep control circuit 16 further generates a control signal, designated CONTROL, which is provided to preselected other circuits of SRAM 10, including input buffer 20, as well as, in a preferred embodiment, all other input buffers (except the ZZ buffer and the small clock monitor) such as the address and data input buffers. The control signal disables the input buffers in the manner described below. Sleep control circuit 16 includes means for outputting the disable signal such that the internal clock signal, designated CLKI, is maintained for at least one clock pulse after the reduced power command signal is applied to SRAM 10. As will be explained in further detail, the further clock pulse is operative to clock chip select register 22.

Internal clock buffer/generator 18 is configured to generate a true internal clock signal designated CLKI, as well as a complemented internal clock signal designated CLKIB, both according to the external clock signal EXT CLK. Buffer/generator 18 is further arranged to discontinue generation of CLKI and CLKIB in response to the assertion of the disable signal by sleep control circuit 16, to thereby inhibit clock transitions (which reduces the overall power consumption of SRAM 10).

Input buffer 20 buffers a chip select signal, or as is also known, a chip enable signal, applied to interface pin $14_4$. It should be understood that SRAM 10 may have a plurality of such chip enable signals which, as is well known and conventional in the art, collectively provide for the selection and deselection of SRAM 10. In one contemplated environment, a microprocessor may control the assertion, and deassertion of the chip enable signal.

In the preferred embodiment, input buffer 20 (as well as other input buffers) is controlled asynchronously to be ON or OFF. When the buffers are "ON" they merely pass the signal on its input to its output, as conventional. When the input buffers are OFF, however, such as when the ZZ "sleep" signal is applied to SRAM 10 to generate an active control signal, the respective output signals of the plurality of input buffers (especially the input buffers which buffer control signals like the chip enable signals) appear as though a nonactive signal is being externally applied to the respective input pin. Thus, when ZZ is applied to pin $14_5$ as an active signal, the chip select signal being generated by input buffer 20 is in a non-active state. Since, in the preferred embodiment, the control signals including the chip enable signals are registered, the above-mentioned further clock pulse generated by buffer/generator 18 according to the invention operates to latch the non-active chip enable signals. The latched non-active chip enable signals ensure that SRAM 10 is placed in a deselection mode by selectively "powering down" internal circuits. Thus, the sequence of asynchronously applying the ZZ "sleep" mode signal (which causes a non-active chip enable signal to be generated from buffer 20), delaying for a time interval so that non-active signals can be generated, and then outputting a further clock pulse (which latches the non-active chip enable signal), together, obviates the need to deselect SRAM 10 externally prior to applying the ZZ "sleep" mode signal (the reduced power command signal). The foregoing substantially simplifies the external control needed to put device 10 into a "sleep" mode (or any chip according to the present invention). Specifically, only one pin need be dedicated to putting the device into the "sleep" mode (reduced power).

Figure 2:
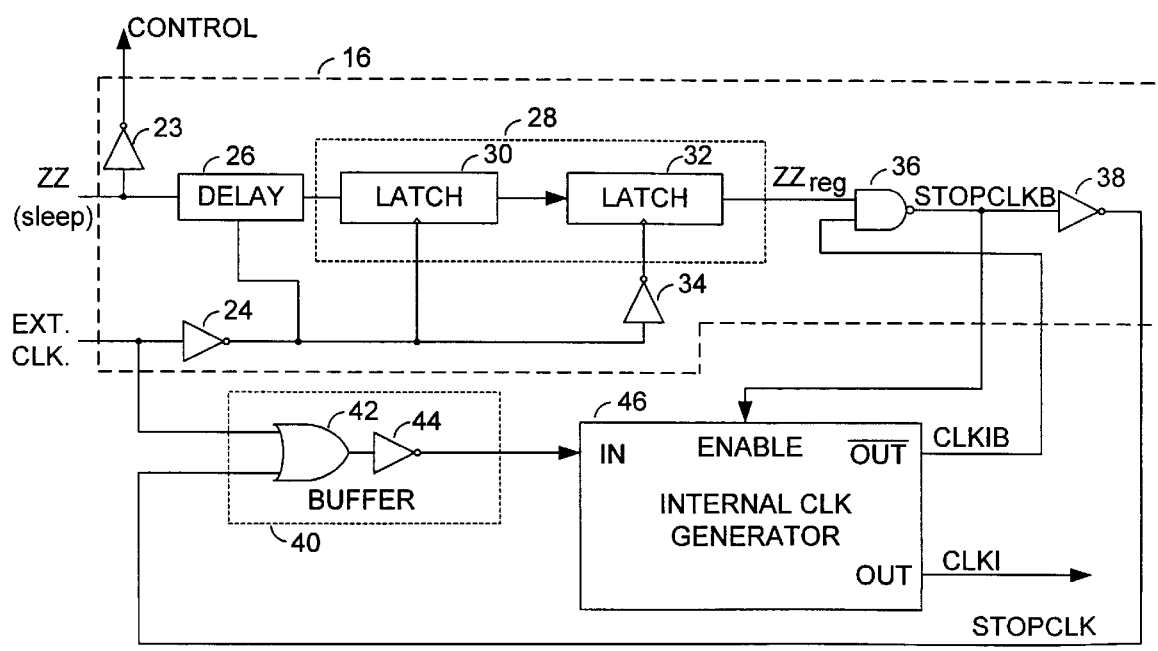
FIG. 2 is a simplified schematic and block diagram showing, in greater detail, the sleep control circuit and the internal clock buffer/generator circuit of FIG. 1.

FIG. 2 shows circuits 16 and 18 in greater detail. Sleep control circuit 16 may include a buffer 23, a small clock monitor element 24, a delay block 26, a pipeline register 28 comprising a first latch 30 and a second latch 32, a first inverter gate 34, a two-input NAND gate 36, and a second inverter gate 38.

Buffer 23 may alternatively comprise an inverting buffer 23' (not shown). Buffer (23 or 23') provides the control signal to other input buffers, having a polarity (true or inverted) as required by the receiving input buffer.

Small clock monitor 24 is illustrated as an inverter; however, in an alternate embodiment, a non-inverting buffer may be employed. The logic function performed by monitor 24 is merely incidental to its buffering function of the externally applied clock signal EXT CLK. In accordance with the invention, monitor 24 may be the only element switching according to the external clock signal once "power down" has been completed after applying an active ZZ "sleep" mode signal to SRAM 10.

Delay block 26 is configured to insert a predetermined delay into the propagation path of signal ZZ. Since signal ZZ is applied asynchronously relative to the external clock signal EXT CLK, a predetermined delay must be inserted to insure that the overall circuit will perform as expected whenever ZZ transitions between active and nonactive states (i.e., the setup and hold criteria of latch 30 is an important parameter). Implementations of delay block 26 suitable for use in the present invention are conventional and well-known in the art.

First latch 30 has an input terminal, an output terminal and a clock terminal, wherein the input terminal is arranged to receive a "delayed" ZZ signal from delay block 26. Second latch 32 also has an input terminal, an output terminal and a clock terminal, wherein the input terminal of latch 32 is connected to the output terminal of latch 30. In the preferred embodiment, latches 30 and 32 respond to a rising edge applied to their respective clock input terminals. However, alternate embodiments using latches responsive to falling edges on their clock input terminals are contemplated as within the scope of the present invention. Latches 30 and 32 are clocked, in the illustrated embodiments, according to an inverted external clock signal, and a true external clock signal, respectively. Latch 32 outputs a registered ZZ "sleep" mode signal, designated $ZZ_{reg}$ in FIG. 2.

NAND gate 36 has a first input terminal configured to receive $ZZ_{reg}$, a second input terminal configured to receive CLKIB, and an output terminal for generating a complemented stopclock signal, designated STOPCLKB. The CLKIB signal defines a feedback signal for insuring that the CLKI signal is not falsely generated, as will be described in further detail hereinafter.

Second inverter gate 38 inverts the STOPCLKB signal to define a true stopclock signal, designated STOPCLK. Thus, the disable signal illustrated in FIG. 1 comprises the true stopclock signal STOPCLK, and the complemented stopclock signal, designated STOPCLKB.

Buffer/generator circuit 18 includes a gated clock buffer circuit 40 that comprises a NOR gate 42 and a third inverter gate 44, and an internal clock generator circuit 46.

Gated clock buffer 40 is configured to selectively pass the external clock signal EXT CLK according to the STOPCLK signal, which, as indicated above, functions as a disable signal. It should be understood that there are a plurality of structures, well-known and conventional in the art, that perform the function required of buffer 40 and are accordingly within the spirit and scope of the present invention. The structure of buffer 40 is exemplary only. Gated buffer 40 generates a buffered external clock signal on an output terminal thereof.

Internal clock generator 46 is arranged to receive the buffered external clock signal from buffer 40 on an input terminal, and further includes a pair of output terminals for generating the CLKI and CLKIB signals in response thereto. Generator 46 also includes an ENABLE terminal configured to receive the STOPCLKB signal (operating as a disable signal). Generator 46 is configured to discontinue generation of the CLKI and CLKIB signals in response to the STOPCLKB signal (in a logic high state in the preferred embodiment). Specifically, internal clock generator 46 forces CLKI continuously low and CLKIB continuously high when disabled to thereby inhibit state transitions. Inhibiting state transitions of the clock reduces power consumption of the device.

Figure 3:
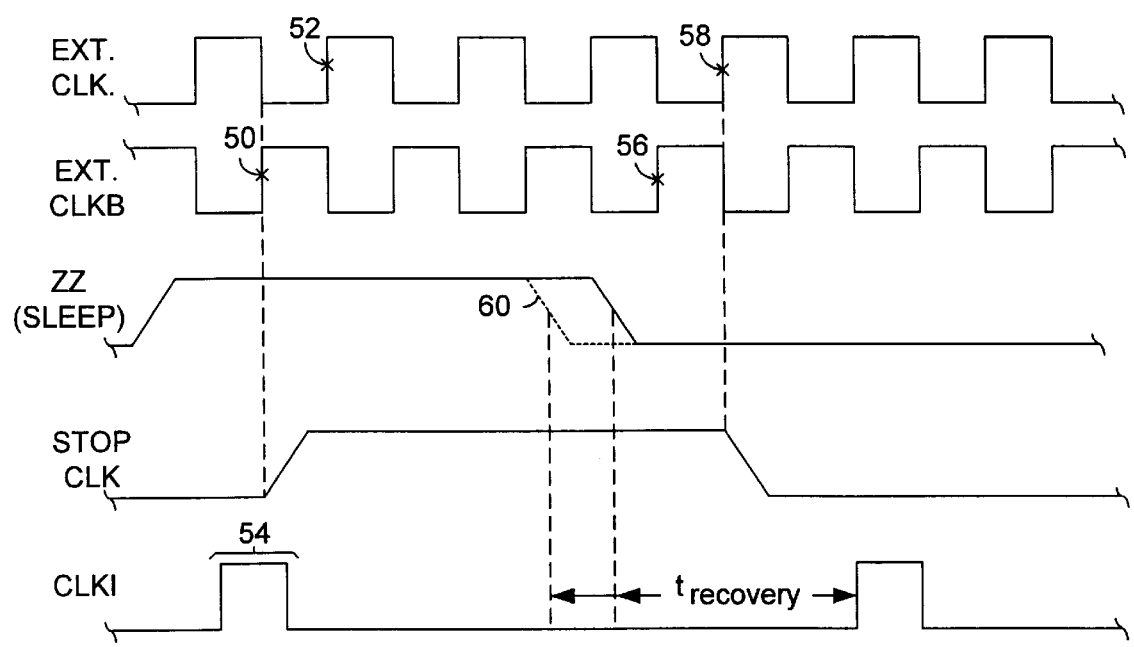
FIG. 3 is a series of timing waveform diagrams illustrating particular aspects of the operation of the invention.

FIG. 3 shows a series of timing chart diagrams in connection with which a description of the operation of an SRAM embodiment of the invention will be set forth. Initially assume that ZZ has been low for at least two or three clock cycles of the EXT. CLK. signal such that a low logic signal will have been clocked through to the output of pipeline register 28. While the reduced power command signal (e.g., the ZZ "sleep" mode signal) remains a logic low, $ZZ_{reg}$, being in a logic low state, maintains the NAND 36 output, namely, the STOPCLKB signal, in a logic high state. This maintains the internal clock generator 46 in an enabled state. Likewise, the STOPCLK signal generated by gate 38 is maintained in a logic low state, which is applied to one input of NOR gate 42 to keep buffer 40 enabled. The logic low at the input of NOR 42 causes NOR 42 to operate as an inverter to invert EXT CLK. The inverted EXT CLK signal is again inverted by inverter 44 to produce a true, but buffered, EXT CLK signal. The buffered external clock signal applied to internal clock generator 46 thus follows the external clock signal applied to interface pin $14_3$ (save for a small propagation delay through buffer 40). The foregoing (i.e., ZZ=0) describes the "normal" mode of operation, and the CLKI signal from generator 46 is subsequently buffered and distributed to other circuits of SRAM 10.

It should be understood that the ZZ signal is applied asynchronously relative to the external clock signal EXT CLK. Therefore, it may be applied when the external clock signal is either high or low. In FIG. 3, the ZZ signal is illustrated as being asserted when the EXT CLK signal is low. This is arbitrary and the operation of the invention is not substantially changed when ZZ is asserted when the EXT CLK signal is high.

With continued reference to FIG. 3, when the reduced power mode of operation is desired, the ZZ signal is asserted (e.g. ZZ=1 in the preferred embodiment) asynchronously relative to the external clock signal. Since in the illustrated embodiment small clock monitor 24 is an inverter gate, the first rising edge (i.e., an edge effective to clock the active ZZ signal therethrough) applied to latch 30 after ZZ has been asserted is, in-fact, the first falling edge of the external clock signal EXT CLK. This edge is indicated at 50 in FIG. 3. In addition, since $ZZ_{reg}$ at this point is still low (see description above for the "normal" operation), the STOPCLK and STOPCLKB signals are both inactive, thereby allowing buffer 40 and generator 46 to generate at least one further clock pulse, illustratively designated at 54 in FIG. 3, after ZZ has been asserted.

Also, as noted above, assertion of the ZZ signal causes the input buffers of SRAM 10, particularly those associated with control signals, to produce a signal as if a nonactive signal was being applied externally. Of particular importance, the chip enable input signals, such as the signal illustratively applied to interface pin $14_4$ in FIG. 1, will be generated by the respective input buffers (e.g., buffer 20 in FIG. 1) as non-active signals. As noted above, this occurs when the ZZ signal is asserted. Inasmuch as the chip enable input buffers now output nonactive signals, the above-mentioned further clock signal is operative to register the chip enable registers, thus deselecting the device internally. This is a particular advantage since it obviates the need to externally deselect the chip prior to asserting 22 (as with conventional approaches), while simultaneously providing a simple, one pin control of the device for implementing the "sleep" mode.

With continued reference to FIG. 3, latch 32 responds to edge 52, thereby clocking the active ZZ signal to NAND gate 36 to produce an active $ZZ_{reg}$. Since $ZZ_{reg}$ is now in a logic high state, the disable signals, namely, STOPCLK and STOPCLKB, are now active. Active disable signals operate to discontinue, in a controlled fashion, the generation of the CLKI and CLKIB signals.

Due to the pipeline register architecture, a recovery time interval, designated $t_{recovery}$, is required after deasserting the ZZ signal before an active CLKI signal is again generated. Thus, as shown in FIG. 3, two edges 56 and 58 are required after ZZ is deasserted before the STOPCLK signal is deactivated.

A worst case recovery time occurs when the ZZ signal is deactivated just after occurrence of an edge of the external clock signal that would be operative to clock the latch 30. For example, as shown in FIG. 3, when the ZZ signal is deasserted along edge 60 (dashed-line), which is just after the rising edge of a complemented external clock signal, several clock cycles are required to before CLKI is again generated. The next occurring rising edge applied to latch 30 occurs at edge 56. Under these circumstances, almost three full clock cycles of the external clock occur before clock pulses are again generated for the CLKI signal.

One advantage of the invention is the substantial reduction in power consumption due to disabling the external clock. When in the low power mode, the only current being drawn by SRAM 10 is leakage current, particularly the TTL standby current of the ZZ signal input buffer, and the TTL current of the small clock buffer monitor 24. Without the ZZ "sleep" mode functionality according to the present invention, the current drawn by such a device may be expected to range in the tens of milliamps. The reduced power consumption is advantageous for use of SRAM 10, and, semiconductor devices according to the invention in general, in such applications as laptop computers where power consumption is of critical importance.

Another advantage of the present invention is that it provides a controlled manner of shutting down or disabling the internal clock without causing false clock edges to be generated, thereby preserving data integrity, as well as maintaining the device in a known state. To fully appreciate the complexity involved and the advance occasioned by the invention, note that generator 46 is designed to generate an internal clock signal having a predefined pulsewidth as required by the internal circuitry of device 10. Generator 46 is further configured to generate a logic high signal on CLKI when it is enabled, and when the input thereto is high. With this in mind, several problems may arise if startup or shutdown of the internal clock is not precisely controlled. First, if buffer 40 is continuously enabled and only the generator 46 is controlled by the ZZ signal, then a false edge or pulse may occur when the ZZ signal is deasserted (brought high-to-low) at a time when the external clock signal EXT. CLK. is high. Specifically, a clock pulse may be generated under these circumstances which has a foreshortened pulsewidth and which may be inadequate to stably operate the device.

On the other hand, were only clock buffer 40 to be controlled by the ZZ signal, a false trigger may occur if the ZZ signal is asserted (low-to-high) when the external clock signal EXT CLK is low, because disabling the clock buffer causes it to generate a logic high on its output (i.e., which is in fact the opposite state of EXT CLK under the foregoing assumptions). As noted above, this will cause the generator 46 to generate a logic high output, which is an incorrect state as defined by the master external clock input to device 10.

Thus, another feature of the present invention is the pipeline register 28, which insures that buffer 40 is disabled only when the external clock is high (thus preserving the correspondence between EXT CLK and the buffered EXT CLK signal provided to generator 46). To completely disable generation of an internal clock signal, however, a logic low must be provided on the ENABLE input of generator 46 (i.e., make the STOPCLKB signal go low). To avoid the problem of disabling generator 46 at the wrong time (referred to above), feedback is used to confirm when generator 46 is in the proper state prior to disabling its output. This is accomplished by feeding back the CLKIB signal to NAND gate 36. This feedback insures that the generator 46 is not switched off (i.e., disabled) until the CLKI signal is low, which is the same logic state of CLKI when generator 46 is disabled. This insures that no internal clock pulses of the CLKI signal are truncated.

While the invention has been particularly shown and described with reference to the preferred embodiments thereof, it is well understood by those skilled in the art that various changes and modifications can be made in the invention without departing from the spirit and scope thereof. For example, complementary logic may be used. Particularly, an AND gate may be substituted for NAND gate 36, so that such AND gate generates STOPCLK and INVERTER 38 generates STOPCLKB.

I claim:

1. A semiconductor device having a reduced power mode comprising:

means for outputting a disable signal responsive to a reduced power command signal, said outputting means including (i) a first latch configured to receive said reduced power command signal and (ii) a second latch producing said disable signal in response to an output of said first latch; and, means for generating an internal clock signal configured to discontinue said internal clock signal in response to said disable signal;

wherein said means for outputting said disable signal maintains said internal clock signal for at least one clock pulse after said reduced power command signal is applied to said device.

2. The device of claim 1 wherein said first latch and said second latch are clocked according to an external clock signal and an inverted external clock signal, respectively.

3. The device of claim 1 wherein said outputting means further includes:

a NAND gate having a first input terminal, a second input terminal, and an output terminal wherein said NAND gate first input terminal is coupled to said second latch output terminal, said NAND gate second input terminal being configured to receive a feedback signal corresponding to said internal clock signal, said NAND gate output terminal generating a complementary stopclock signal; and, a first INVERTER gate having an input terminal and an output terminal wherein said first INVERTER input terminal is coupled to said NAND gate output terminal, said first INVERTER gate output terminal generating a true stopclock signal;

wherein said disable signal comprises said true stopclock signal and said complementary stopclock signal.

4. The device of claim 3 wherein said internal clock signal generating means includes (i) a clock buffer circuit and (ii) a clock signal generator.

5. The device of claim 1 wherein said internal clock signal generating means includes (i) a clock buffer circuit and (ii) a clock signal generator.

6. The device of claim 4 wherein said clock buffer circuit includes:

a NOR gate having a first input terminal, a second input terminal, and an output terminal wherein said NOR gate first input terminal is configured to receive said external clock signal, said NOR gate second input terminal is configured to receive said true stopclock signal; and, a second INVERTER gate having an input terminal and an output terminal wherein said second INVERTER gate input terminal is coupled to said NOR gate output terminal, said second INVERTER gate output terminal being configured to generate a buffered external clock signal.

7. The device of claim 6 wherein said internal clock generator includes an input terminal configured to receive said buffered external clock signal, and said clock generator further includes (i) an enable terminal configured to receive said complementary stopclock signal and (ii) including an output terminal configured to generate said internal clock signal in the absence of said complementary stopclock signal.

8. The device of claim 1 wherein said reduced power command signal is applied to said device asynchronously relative to an external clock signal.

9. A static random access memory (SRAM) device having a reduced power mode comprising:

means for outputting a disable signal responsive to a reduced power command signal applied to said device asynchronously relative to an external clock signal;

means for generating an internal clock signal configured to discontinue said internal clock signal in response to said disable signal, and;

at least one chip enable register for deselecting said device in a predetermined fashion;

wherein said means for outputting said disable signal maintains said internal clock signal for at least one clock pulse after said reduced power command signal is applied to said device, and said at least one internal clock pulse is operative to clock a non-active chip enable signal into said at least one chip enable register to thereby obviate the need to deselect said device prior to applying said reduced power command signal.

10. A semiconductor device having a reduced power mode comprising:

a control circuit having an input terminal configured to receive a command signal and generate a disable signal in response thereto; and, an internal clock generator having (i) an input terminal configured to receive an external clock signal, (ii) an output terminal configured to output an internal clock signal and (iii) an enable terminal configured to discontinue said internal clock signal in response to said disable signal;

said control circuit including a pipeline register configured to control generation of said disable signal such that said internal clock signal is maintained for at least one clock pulse after said command signal is received by said control circuit.

11. The device of claim 10 wherein said pipeline register includes:

a first latch arranged to receive said reduced power command signal;

a second latch connected to said first latch, said second latch being configured to generate said disable signal.

12. The device of claim 11 wherein said control circuit further includes:

a NAND gate having a first input terminal, a second input terminal, and an output terminal wherein said NAND gate first input terminal is coupled to said second latch output terminal, said NAND gate second input terminal being configured to receive a feedback signal corresponding to said internal clock signal, said NAND gate output terminal generating a complementary stopclock signal; and, a first INVERTER gate having an input terminal and an output terminal wherein said first INVERTER gate input terminal is coupled to said NAND gate output terminal, said first INVERTER gate output terminal generating a true stopclock signal;

wherein said disable signal comprises said true stopclock signal and said complementary stopclock signal.

13. The device of claim 12 further including a clock buffer circuit comprising:

a NOR gate having a first input terminal, a second input terminal, and an output terminal wherein said NOR gate first input terminal is configured to receive said external clock signal, said NOR gate second input terminal being configured to receive said true stopclock signal; and, a second INVERTER gate having an input terminal and an output terminal wherein said second INVERTER gate input terminal is coupled to said NOR gate output terminal, said second INVERTER gate output terminal being configured to generate said buffered external clock signal.

14. A method of operating a semiconductor device comprising the steps of:

(A) generating an internal clock signal having a plurality of pulses in response to an external clock signal;

(B) instructing said device to reduce power consumption;

(C) generating at least one further internal clock pulse after said instructing step; and, (D) discontinuing said internal clock signal thereafter.

15. The method of claim 14 wherein said instructing step comprises applying a reduced power signal to said device.

16. The method of claim 15 further including the steps of:

discontinuing said applying step; and, delaying, for a predetermined time interval, said generating step (C).

17. The method of claim 14 wherein step (B) is performed asynchronously relative to said external clock signal.

18. The method of claim 14 wherein said at least one clock pulse is operative to clock a non-active chip enable signal into a chip enable register of said device to thereby obviate externally applying deselection signals to said device prior to applying said reduced power command signal.

19. The method of claim 15 wherein said predetermined time interval comprises a first period of time to write said reduced power signal in a first latch.

20. The method of claim 19 wherein said predetermined time interval further comprises a second period of time sufficient to write said reduced power signal in a second latch.

21. A semiconductor device having a reduced power mode comprising:

means for outputting a disable signal responsive to a reduced power command signal; and, means for generating an internal clock signal configured to discontinue said internal clock signal in response to said disable signal, said internal clock signal generating means including (i) a clock buffer circuit and (ii) a clock signal generator, said clock buffer circuit having:

a NOR gate with a first input terminal, a second input terminal, and an output terminal wherein said NOR gate first input terminal is configured to receive said external clock signal, and said NOR gate second input terminal is configured to receive a true stop-clock signal; and, an INVERTER gate having an input terminal and an output terminal wherein said INVERTER gate input terminal is coupled to said NOR gate output terminal, said INVERTER gate output terminal being configured to generate a buffered external clock signal;

wherein said means for outputting said disable signal maintains said internal clock signal for at least one clock pulse after said reduced power command signal is applied to said device.

\* \* \* \* \*